(12) United States Patent
Shibazaki

(10) Patent No.: US 8,668,191 B2
(45) Date of Patent: Mar. 11, 2014

(54) HOLDING UNIT, ASSEMBLY SYSTEM, SPUTTERING UNIT, AND PROCESSING METHOD AND PROCESSING UNIT

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/317,994

(22) Filed: Nov. 2, 2011

(65) Prior Publication Data

US 2012/0055786 A1    Mar. 8, 2012

Related U.S. Application Data

(62) Division of application No. 11/509,648, filed on Aug. 25, 2006, now Pat. No. 8,070,145.

(60) Provisional application No. 60/727,829, filed on Oct. 19, 2005.

(30) Foreign Application Priority Data

Aug. 26, 2005    (JP) .................................. 2005-245439

(51) Int. Cl.
*B25B 11/00*    (2006.01)
*H01L 39/24*    (2006.01)

(52) U.S. Cl.
USPC .................................... 269/8; 29/599; 269/37

(58) Field of Classification Search
USPC ....... 269/8, 37, 46, 55, 289 R; 29/281.1, 559, 29/599; 204/298.04; 335/289–291
See application file for complete search history.

(56) References Cited

U.S. PATENT DOCUMENTS

| 4,346,164 | A | 8/1982 | Tabarelli et al. |
| 4,480,910 | A | 11/1984 | Takanashi et al. |
| 5,542,559 | A | 8/1996 | Kawakami et al. |
| 5,610,683 | A | 3/1997 | Takahashi |
| 5,715,039 | A | 2/1998 | Fukuda et al. |
| 5,825,043 | A | 10/1998 | Suwa |
| 6,333,572 | B1 | 12/2001 | Ono |

(Continued)

FOREIGN PATENT DOCUMENTS

| DE | 221 563 A1 | 4/1985 |
| DE | 224 448 A1 | 7/1985 |

(Continued)

OTHER PUBLICATIONS

Nov. 21, 2006 Written Opinion of the International Searching Authority issued in International Application No. PCT/JP2006/316721 (with translation).

(Continued)

*Primary Examiner* — Hadi Shakeri
(74) *Attorney, Agent, or Firm* — Oliff PLC

(57) ABSTRACT

Because an electromagnetic chuck supplies current to a specific microcoil among a plurality of microcoils and makes an object exert an electromagnetic force working together with a magnet of the object, the object can be held in a state where the object is set at a desired position (a position that corresponds to the microcoil to which current has been supplied) on a base surface. Further, by gas that blows out from a gas supply passage, a levitation force is given to the object, which can reduce effects of a friction force that acts between the object and an upper surface of the electromagnetic chuck when the position of the object is set.

6 Claims, 14 Drawing Sheets

(56) References Cited

U.S. PATENT DOCUMENTS

| | | | |
|---|---|---|---|
| 6,435,948 B1 * | 8/2002 | Molnar .......................... 451/41 |
| 6,576,860 B2 * | 6/2003 | Koshimizu et al. ...... 219/121.43 |
| 2004/0165159 A1 | 8/2004 | Lof et al. |
| 2007/0242242 A1 | 10/2007 | Nagasaka et al. |
| 2008/0151200 A1 | 6/2008 | Takaiwa |

FOREIGN PATENT DOCUMENTS

| | | |
|---|---|---|
| EP | 0 866 375 A2 | 9/1998 |
| JP | U1-56-151729 | 11/1981 |
| JP | A-58-202448 | 11/1983 |
| JP | A-59-019912 | 2/1984 |
| JP | A-62-065326 | 3/1987 |
| JP | A-63-157419 | 6/1988 |
| JP | A-04-305915 | 10/1992 |
| JP | A-04-305917 | 10/1992 |
| JP | A-05-062877 | 3/1993 |
| JP | A-06-124873 | 5/1994 |
| JP | A-07-220990 | 8/1995 |
| JP | A-08-264359 | 10/1996 |
| JP | A-08-316125 | 11/1996 |
| JP | A-10-256355 | 9/1998 |
| JP | A-10-303114 | 11/1998 |
| JP | A-10-340846 | 12/1998 |
| JP | A-11-074182 | 3/1999 |
| JP | A-11-176727 | 7/1999 |
| JP | A-2000-058436 | 2/2000 |
| JP | A-2000-125536 | 4/2000 |
| JP | A-2001-170835 | 6/2001 |
| JP | A-2002-194540 | 7/2002 |
| JP | A-2004-90114 | 3/2004 |
| JP | A-2004-114234 | 4/2004 |
| JP | A-2004-243333 | 9/2004 |
| JP | A-2005-336520 | 12/2005 |
| WO | WO 99/49504 A1 | 9/1999 |
| WO | WO 2004/019128 A2 | 3/2004 |

OTHER PUBLICATIONS

Jun. 25, 2010 Office Action issued in U.S. Appl. No. 11/509,648.
Jan. 4, 2010 Office Action issued in U.S. Appl. No. 11/509,648.
Apr. 13, 2011 Office Action issued in U.S. Appl. No. 11/509,648.
Sep. 13, 2011 Notice of Allowance issued in U.S. Appl. No. 11/509,648.
Dec. 14, 2011 Office Action issued in Japanese Patent Application No. 2007-532197 (with translation).
Feb. 24, 2012 Office Action issued in Japanese Patent Application No. 2007-532197 (with translation).
Feb. 5, 2013 Office Action issued in Taiwanese Patent Application No. 095131265.
Feb. 5, 2013 Office Action issued in Taiwanese Patent Application No. 095131265 (with translation).
Sep. 3, 2013 Office Action issued in Japanese Patent Application No. 2012-079199 (with translation).

* cited by examiner

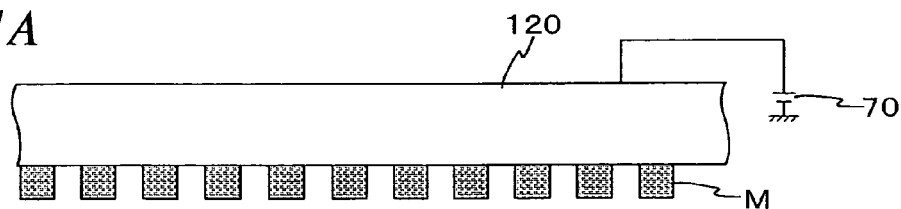
Fig. 11A
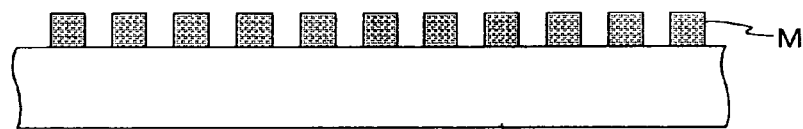
Fig. 11B
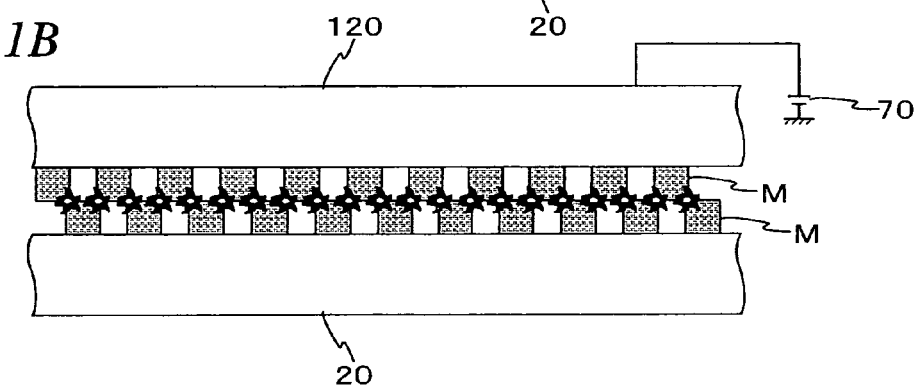
Fig. 11C
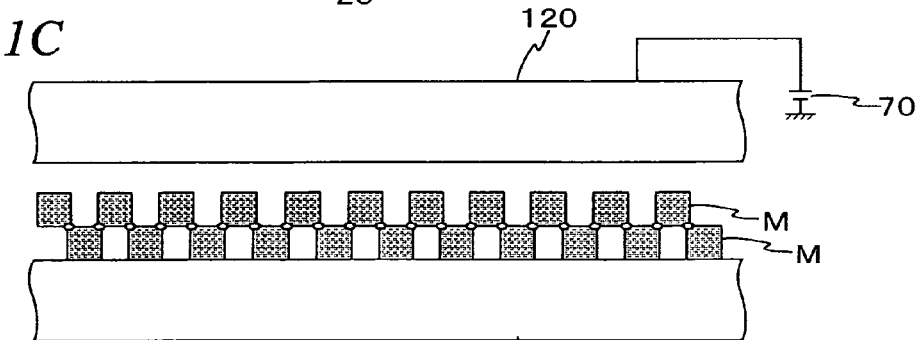
Fig. 11D
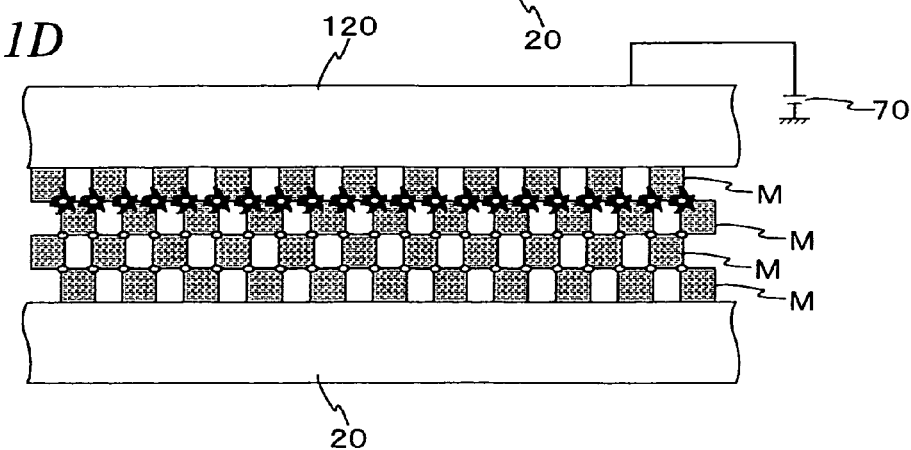

HOLDING UNIT, ASSEMBLY SYSTEM, SPUTTERING UNIT, AND PROCESSING METHOD AND PROCESSING UNIT

CROSS-REFERENCE TO RELATED APPLICATIONS

This is a Division of application Ser. No. 11/509,648 filed Aug. 25, 2006, which claims the benefit of Japanese Patent Application No 2005-245439 filed Aug. 26, 2005 and U.S. Provisional Application No. 60/727,829 filed Oct. 19, 2005. The disclosures of the prior applications are hereby incorporated by reference herein in their entirety.

BACKGROUND OF THE INVENTION

1. Field of the Invention

The present invention relates to holding units, assembly systems, sputtering units, and processing methods and processing units, and more particularly to a holding unit that holds an object which at least partially contains a magnetic substance, an assembly system that uses the holding unit, a sputtering unit that forms a thin film on a base material by making ions collide with a target material in vacuum, a processing method in which the object containing the magnetic substance at least partially is processed and a processing unit that processes the object.

2. Description of the Related Art

Recently, semiconductor processing technology using micromachining technology is used for integration of fine devices, and MEMS (Micro Electro Mechanical System (or MST (Microsystem Technology))) can be cited as a typical example. MEMS is an ultra-compact sensor, an actuator, and an electromechanical structure by the nanometer unit manufactured in a semiconductor process, especially using micromachining technology, which is based on integrated circuit technology, and refers to a fused unit of a component or a mechanism of an electrical system and a mechanical system on which miniaturization is performed to the limit. The limit in this case, for example, means that the narrowest width of a shape such as an exposed uneven shape is under 100 μm, at least under 1000 μm.

The micromachining technology used in MEMS can be divided into two classes: bulk micromachining by silicon bulk etching; and surface micromachining in which polysilicon, a silicon nitride film, an oxide film and the like are deposited on a silicon, and etching is performed according to a designed shape in order to make a structure.

A fine unit such as an LSI, as well as MEMS, is also produced in large numbers on one silicon wafer using semiconductor manufacturing technology. Therefore, in the final stage in the manufacturing process, dicing has to be performed on the silicon wafer so as to separate each fine unit (e.g. refer to Kokai (Japanese Unexamined Patent Application Publication) No. 11-40520).

By employing the manufacturing method of manufacturing a plurality of devices together on one wafer as is described above, alignment marks formed on a part of the wafer can be used for position setting in order to improve the processing accuracy of lithography transfer applied to each layer. Or in the development or etching process, there is an advantage that the devices can be handled as one large entity called a wafer, which makes the devices very easy to handle. Accordingly, it is not too much to say that such an advantage is one of the many reasons for the rapid progress in the semiconductor manufacturing technology up to the present date.

However, on the other hand, because the processing method of the silicon wafer is limited to the method in which resist coating, exposure, development, etching and doping are sequentially performed and the method has a structural limit of depositing a structural object on a plane and the like, it is relatively difficult to generate a steric fine structure that does not have a deposited structure, and the units (components) that can be manufactured are limited.

Recently, there are cases at a research level where a worker builds a micromachine by assembling fine components using a manipulator; however, the technology for mass-producing such a unit does not exist. Even if research cases on key factors such as a micromotor or internal combustion are publicized, research cases as well as the mass-production technology for combining such factors are limited in the present situation. As is described above, because a micromachine cannot be built by combining new key factors such as the micromotor, the status quo of the current MEMS module is that the modules all have to be manufactured consistently by one company.

On the contrary, if a final module can be manufactured by building up new key factors such as a plurality of micromotors, this can widely broaden the industrial base, which anticipates an increasing development in the industry.

More particularly, for example, it can be considered that by scaling down existing machines, the machines can be applied in various fields. To be more specific, if a nuclear engine can be scaled down by scaling down all the components used in an existing nuclear engine, the possibility arises of the nuclear engine being used as a residential generator, or if a fine actuator can be manufactured by scaling down existing actuators, the possibility arises, for example, of artificial muscles being manufactured by linking together the fine actuators.

However, under present circumstances, there are no signs that show progress in such an approach. The reason for this is attributed to the fact that there is more difficulty in handling the components (assembling, applying secondary processing) that are scaled down than the difficulty in scaling down the components. From such a viewpoint, a technology for fully handling fine components is considered to be necessary.

SUMMARY OF THE INVENTION

The present invention has been made under the situation described above, and according to a first aspect of the present invention, there is provided a first holding unit that holds an object that contains a magnetic substance at least partially, the holding unit comprising: a base on which the object is placed; a plurality of conductive materials arranged in the base that works with the magnetic substance to make the object exert an electromagnetic force; and a levitation force mechanism that gives levitation force to the object.

According to this unit, the object can be set at a desired position that corresponds to the position of the conductive material to which current is supplied, and the object can be held in the state. Further, attraction such as the friction force or the like generated between the object and the base when the position of the object is set can be reduced.

According to a second aspect of the present invention, there is provided a second holding unit that holds an object that contains a magnetic substance at least partially, the holding unit comprising: a base on which the object is placed; a plurality of conductive materials arranged in the base that works with the magnetic substance to make the object exert an electromagnetic force; and an alignment unit that sets the position of the object with respect to the base prior to making the object exert the electromagnetic force.

According to this unit, because the object is made to exert electromagnetic force after the position of the object is set with respect to the base using the alignment unit, the object can be set accurately at a desired position that corresponds to the position of the conductive material to which current is supplied, and the object can be held in the state.

According to a third aspect of the present invention, there is provided a third holding unit that holds an object that contains a magnetic substance at least partially, the holding unit comprising: a base on which the object is placed; a plurality of microcoils arranged in the base that works with the magnetic substance to make the object exert an electromagnetic force; and a control unit that connects to the plurality of microcoils and performs switching between supplying current to each of the microcoils and stopping the supply of current.

According to this unit, because the control unit performs supplying current and stopping the supply of current to each of the plurality of microcoils arranged in the base, the object can be set at a desired position (corresponding to the position of the microcoil to which current is supplied) at an appropriate timing, and the object can be held in the state.

According to a fourth aspect of the present invention, there is provided a processing unit, the unit comprising: a first to third holding unit of the present invention that holds an object which contains a magnetic substance at least partially; and a processing object that applies processing to the object held by the holding unit, wherein a relative positional relation between the holding unit and the processing object is variable.

According to this unit, the processing object applies processing to the object held by the first to third holding unit of the present invention and by performing the processing on the object whose position has been set, processing with high precision can be realized.

According to a fifth aspect of the present invention, there is provided an assembly system, the system comprising: a first holding unit consisting of a first to third holding unit of the present invention that holds a first object which contains a magnetic substance at least partially; and a second holding unit that holds a second object, which is placed facing the first object held by the first holding unit.

According to this system, by placing the first holding unit and the second holding unit so that the units face each other, the first object and the second object can be made to have a predetermined positional relation, which allows the assembly using the first object and the second object to be performed with good accuracy.

According to a sixth aspect of the present invention, there is provided a sputtering unit that forms a thin film on a base material by making ions collide with a target material, the unit comprising: a base that has a plurality of microcoils and holds the base material; and a control unit that connects to the plurality of microcoils and performs switching between supplying current to each of the microcoils and stopping the supply of current.

According to this unit, because the control unit connecting to the plurality of microcoils performs switching between supplying current to each of the microcoils and stopping the supply of current, a magnetic field is formed on the surface of the side where the base material is held, which makes it possible to form a thin film that corresponds to the magnetic field that has been formed. Accordingly, by controlling the magnetic field with the control unit that performs switching between supplying current and stopping the supply of current, it becomes possible to form a thin film that has a desired pattern.

According to a seventh aspect of the present invention, there is provided a first processing method in which a first object that contains a magnetic substance at least partially is processed using a second object wherein a levitation force is given to the first object placed on a base, a plurality of conductive materials arranged in the base works with the magnetic substance to make the first object exert an electromagnetic force; and the second object is made to move close to or to be in contact with the first object.

According to this method, because the second object can be made to come closer or to be in contact with high precision with the first object, it becomes possible to process the first object with high precision by the second object.

According to an eighth aspect of the present invention, there is provided a second processing method in which a first object that contains a magnetic substance at least partially is processed using a second object wherein alignment is performed on the first object with respect to a base, a plurality of conductive materials arranged in the base works with the magnetic substance to make the first object exert an electromagnetic force; and the second object is made to move close to or to be in contact with the first object.

According to this method, because the second object can be made to come closer or to come into contact with good precision to the first object whose position has been set with high precision, it becomes possible to process the first object with high precision by the second object.

According to a ninth aspect of the present invention, there is provided a third processing method in which a first object that contains a magnetic substance at least partially is processed using a second object wherein switching is performed between supplying current to a plurality of microcoils placed on a base where the first object is arranged and stopping the supply of current, the first object is made to exert an electromagnetic force generated between the microcoils and the magnetic substance, and the second object is made to move close to or to be in contact with the first object.

According to this method, by individually performing switching between supplying current and stopping the supply of current to a plurality of microcoils, the first object can be set with high precision at a position corresponding to a specific microcoil. Accordingly, it becomes possible to make the second object come closer or to come into contact with good precision to the first object, therefore it becomes possible to process the first object with high precision by the second object.

According to a tenth aspect of the present invention, there is provided a first processing unit that processes an object having a magnetic substance portion that contains a magnetic substance partially and an empty space portion formed in a state substantially enclosing the magnetic substance portion, the unit comprising: a base that has a holding surface that can hold the object; a magnetic suction unit arranged in the base that can magnetically suction the magnetic substance portion working with the magnetic substance; and a movement unit that moves the base in a direction intersecting with the holding surface in a state where the magnetic suction unit magnetically suctions the magnetic substance portion but does not magnetically suction the empty space portion.

According to this unit, because only the magnetic substance portion magnetically suctioned by the magnetic suction unit moves along with the base by the movement unit moving the base in the direction intersecting with the holding surface in a state where the magnetic suction unit magnetically suctions the magnetic substance portion but does not magnetically suction the empty space portion, the magnetic substance portion and the section connecting to the magnetic substance portion can be transformed in accordance with the movement direction of the base.

According to an eleventh aspect of the present invention, there is provided a second processing unit that processes an object having a magnetic substance portion that contains a magnetic substance partially and an empty space portion formed in a state substantially enclosing the magnetic substance portion, the unit comprising: a first base that has a holding surface that can hold the object; a magnetic suction mechanism arranged in the first base that can magnetically suction the magnetic substance portion working with the magnetic substance; a second base arranged facing the first base with the object in between; and a suction unit arranged in the second base that suctions a portion of the object that is not magnetically suctioned by the magnetic suction mechanism.

According to this unit, because the magnetic suction mechanism that magnetically suctions the magnetic substance is arranged in the first base and the suction unit that vacuum suctions a portion that is not magnetically suctioned by the magnetic suction mechanism is arranged in the second base, by moving at least one of the first base and the second base in a state where the object is held between the first base and the second base, it becomes possible to apply processing to the object according to the movement direction.

BRIEF DESCRIPTION OF THE DRAWINGS

In the accompanying drawings;

FIG. 11A is a view for describing a second embodiment;

FIG. 11B is a view for describing the second embodiment;

FIG. 11C is a view for describing the second embodiment;

FIG. 11D is a view for describing the second embodiment;

DESCRIPTION OF THE EMBODIMENTS

A First Embodiment

Figure 1:
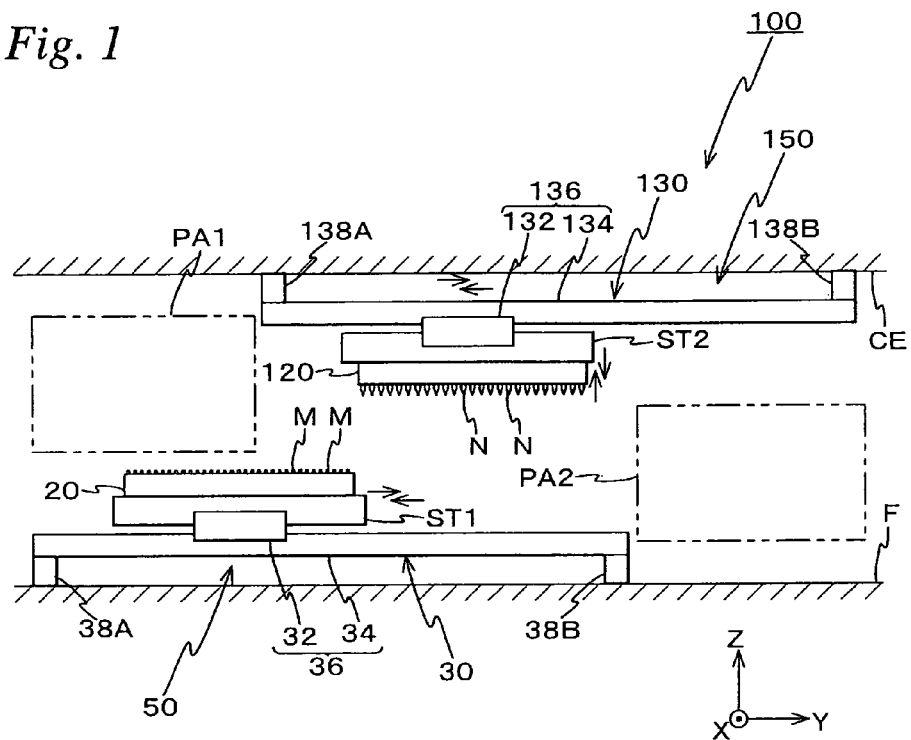
FIG. 1 is a view schematically showing a configuration of an assembly system related to a first embodiment.

A first embodiment of the present invention will be described below, referring to FIGS. 1 to 9. FIG. 1 shows an assembly system 100 related to the first embodiment. Assembly system 100 is a system for applying processing to a fine structure such as a MEMS device, an LSI or the like.

Assembly system 100 is installed entirely in, for example, a housing that has a floor surface F and a ceiling surface CE, and the system is equipped with a first holding unit 50 installed on floor surface F of the housing, a second holding unit 150 supported hanging from ceiling surface CE of the housing in a state vertically facing first holding unit 50, and pre-alignment units PA1 and PA2 that respectively correspond to first holding unit 50 and second holding unit 150.

The first holding unit 50 also includes a stage (a moving body or a table) ST1, an electromagnetic chuck 20 held on the upper surface of stage ST1, and a movement unit 30 that moves stage ST1 at least in a Y-axis direction (the lateral direction of the page surface in FIG. 1).

Movement unit 30 includes a Y-axis linear motor 36 that has, for example, a mover unit 32 consisting of a magnetic pole unit and a stator unit 34 consisting of an armature unit supported above floor surface F via support members 38A and 38B.

Figure 2:
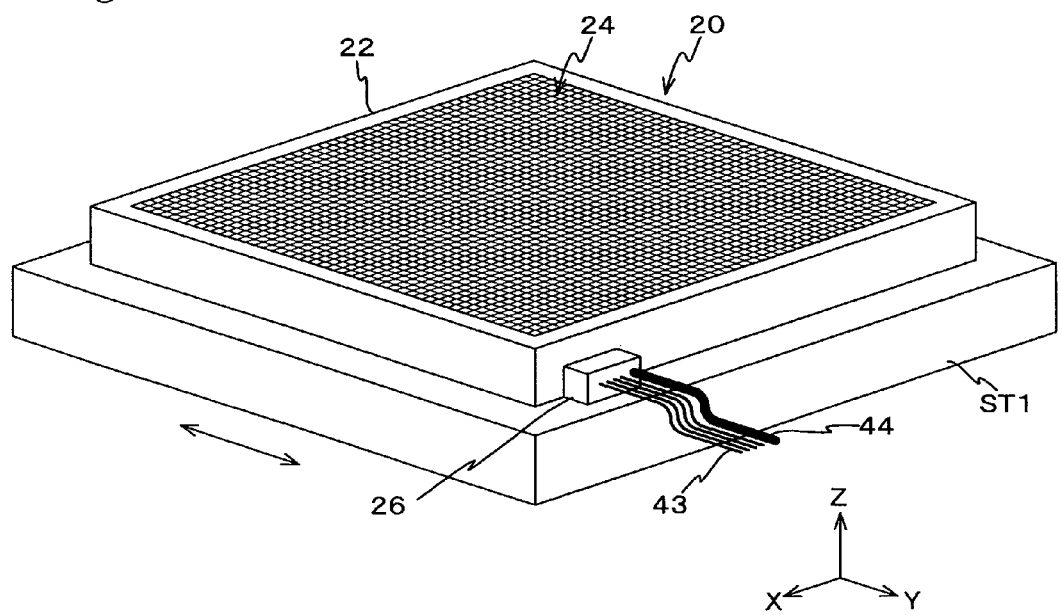
FIG. 2 is a perspective view that shows an electromagnetic chuck and a stage in FIG. 1.

FIG. 2 shows a perspective view of stage ST1 and electromagnetic chuck 20. As is obvious from FIG. 2, stage ST1 has a rough plate-like shape, and on the upper surface (a surface on a +Z side) of stage ST1, electromagnetic chuck 20 is held by suction via a vacuum suction mechanism 91 (not shown in FIG. 2, refer to FIG. 9).

A concrete configuration of electromagnetic chuck 20 will now be described referring to FIG. 2, and also to FIG. 3, which is a longitudinal sectional view of electromagnetic chuck 20.

As is shown in FIG. 2, electromagnetic chuck 20 is equipped with a frame shaped member 22 that has a rough square shape in a planar view, a main body section 24 arranged within the inner space of frame shaped member 22, and a connector section 26 arranged on the edge of frame shaped member 22 on the +Y side for connecting the wiring, piping and the like to main body section 24.

Figure 3:
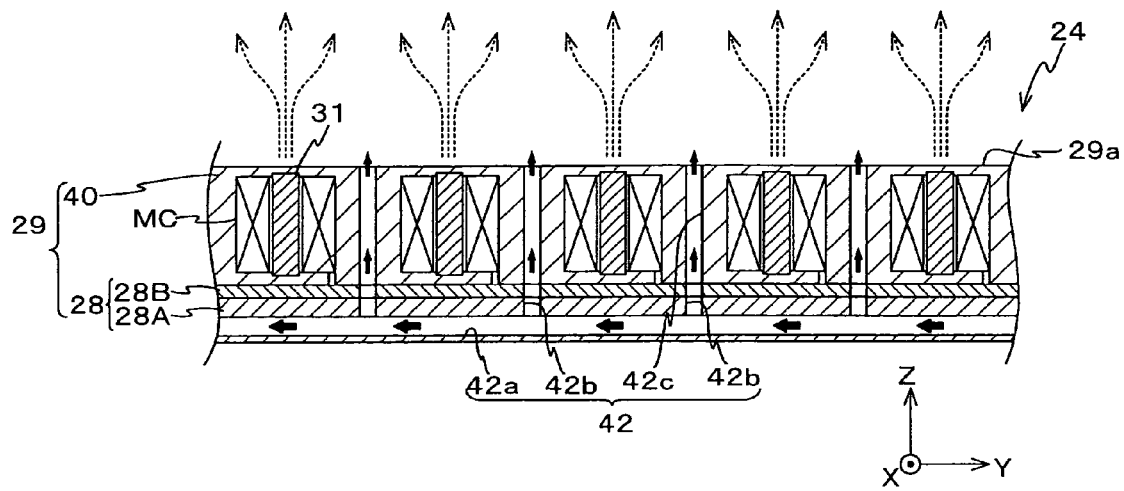
FIG. 3 is a longitudinal sectional view of the electromagnetic chuck.

As is shown in the sectional view in FIG. 3, main body section 24 has a layered structure, and has a wiring board 28 including a plate shaped silicon substrate 28A and a wiring layer 28B formed on the upper surface of silicon substrate 28A, a plurality of microcoils MC disposed in the shape of a matrix on wiring board 28, and an insulation layer 40 arranged to fill in the gap between microcoils MC. In the embodiment, a coil holding board 29 is configured including wiring board 28 and insulation layer 40, and the upper surface of coil holding board 29 is a base surface (holding surface) 29a. Incidentally, the plurality of microcoils MC is disposed, for example, at a pitch of 1 mm.

Wiring layer 28B is formed on silicon substrate 28A by lithography technology using a semiconductor exposure apparatus or the like. One end of a wiring 43 connects to wiring layer 28B via connector 26. The other end of wiring 43 connects to a power supply 92 (not shown in FIG. 3, refer to FIG. 9), and power supply 92 supplies current via wiring 43 and connector 26 to wiring layer 28B under instructions from a controller 90 in FIG. 9.

The plurality of microcoils MC is made of planar microcoils, and is manufactured, for example, undergoing the following process.

(1) First of all, a silicon substrate is prepared, and for example, a photosensitive polyimide precursor is coated on the entire upper surface of the silicon substrate using a spin coat method or the like, and a foundation layer is formed having, for example, a rectangular shape, by performing patterning of the photosensitive polyimide precursor using an exposure apparatus or the like.

(2) Next, after a photoresist is coated by the spin coat method or the like on the foundation layer and its periphery, exposure and development are performed using the semiconductor exposure apparatus and the like, and the photoresist existing on only the range where the microcoils are to be formed (formation range) is removed. Incidentally, as the semiconductor exposure apparatus, the semiconductor exposure apparatus whose details are disclosed in, for example, the pamphlet of International Publication No. WO2004/073053 (corresponding U.S. Patent Application Publication No. 2005/248744) can be used.

(3) Next, platinum (Pt) is deposited on the entire upper surface of the silicon substrate by a sputtering deposition method and a catalytic metal layer is formed, and when the photoresist is removed, the catalytic metal layer resides only in the formation range described above.

(4) Next, an epoxy resin containing a photoreactive curing agent is coated thickly on the entire upper surface by a spin coat method or the like and an epoxy resin layer is formed. Then, patterning of the epoxy resin layer is performed and a form of the microcoil is made. And by the patterning, all the epoxy resin existing in the section where wiring of the microcoil is to be formed is removed (a spiral groove is formed).

(5) Then, copper is precipitated by electroless plating on a part of the catalytic metal layer which exists at the bottom of the form and an electrode for electrolytic plating is made. Electrolytic plating is also applied using the electrode for electrolytic plating, and the wiring is made with the copper between opposing wall surfaces of the spiral groove of the form. Thus, microcoils can be made.

By manufacturing microcoils using such pattern formation by the semiconductor exposure apparatus, fine microcoils can be manufactured at once in large quantity.

The plurality of microcoils MC is arranged in a matrix shape (in an XY two dimensional direction) within coil holding board 29 (on wiring board 28). These microcoils MC are electrically connected to wiring board 28 and are also in a state embedded in insulation layer 40 without the microcoils touching one another so that adjacent microcoils are insulated. Controller 90 can perform switching of the current of each of the microcoils MC between supplying the current and stopping the supply of current.

Further, as is shown in FIG. 3, a magnet core 31 is arranged in each of the hollow section in the center of the plurality of microcoils MC, and by magnet core 31, the magnetic field of microcoils MC can be enhanced.

In main body section 24 configured in the manner described above, a gas supply passage 42 is formed inside, as is further shown in FIG. 3.

More specifically, gas supply passage 42 has a trunk passage 42a, which is formed along a horizontal direction within wiring board 28, a first branch passage 42b, which is formed in a vertical direction from trunk passage 42a within wiring board 28, and a second branch passage 42c formed within insulation layer 40 in a state communicating with the first branch passage 42b. The first branch passage 42b and the second branch passage 42c are formed so as not to interfere with the position of the wiring of wiring board 28, or with the position of the microcoils MC and magnet core 31.

Figure 9:
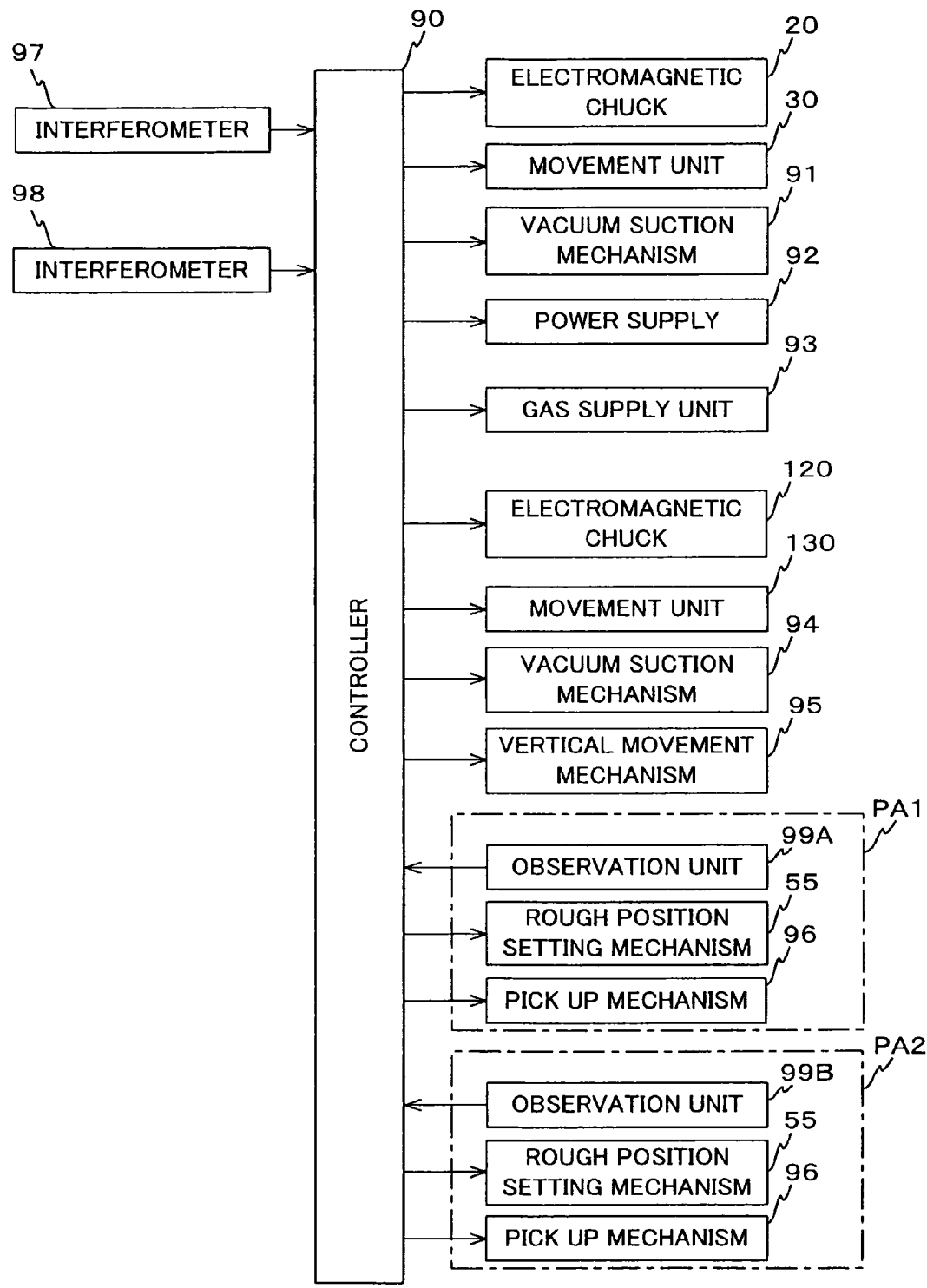
FIG. 9 is a block diagram of a control system related to the first embodiment.

One end of a gas supply pipe 44 (refer to FIG. 2) connects to an end of gas supply passage 42 via connector 26, and the other end of gas supply pipe 44 connects to a gas supply unit 93 (not shown in FIG. 2, refer to FIG. 9). Controller 90 (refer to FIG. 9) controls the gas supply of gas supply unit 93 and makes the gas blow out from the upper surface of electromagnetic chuck 20. The amount of gas that blows out is controlled by controller 90. Incidentally, a configuration can be employed where an electromagnetic valve is arranged in a part of gas supply passage 42 so that the gas blows out from only a part of the upper surface of electromagnetic chuck 20.

Figure 4A:
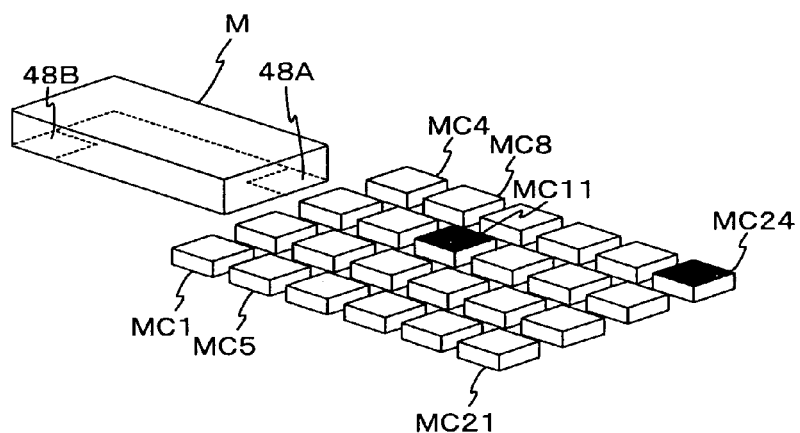
FIG. 4A is a view (No. 1) for describing a configuration and a method of setting a position of an object M.
Figure 4B:
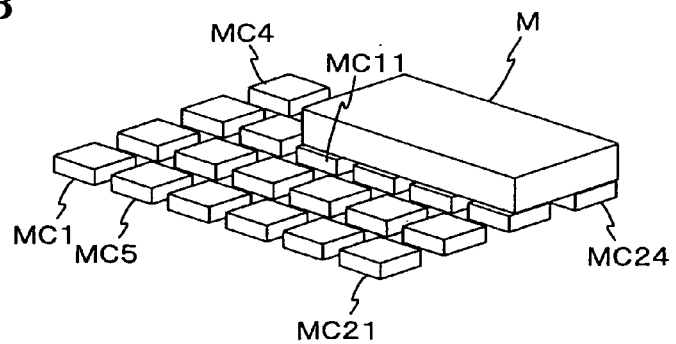
FIG. 4B is a view (No. 1) for describing the configuration and the method of setting the position of object M.

In electromagnetic chuck 20 described above, if the object partially contains a magnetic substance, the object can be positioned in the vicinity of a desired position on electromagnetic chuck 20. However, in the embodiment, in order to perform a more accurate position setting and attitude control, magnets 48A and 48B are arranged on the lower surface side of an object M subject to position setting as is shown in FIG. 4A.

In this case, for example, magnet 48A and magnet 48B are set so that they have a reversed polarity. Accordingly, for example, in the case there are 24 microcoils, microcoils MC1 to MC24, as is modeled in FIG. 4A, by supplying current in opposite directions to microcoil MC11 and microcoil MC24, the position of object M subject to position setting can be set to the position shown in FIG. 4B by magnetic suction. Further, because magnet 48A and magnet 48B have a reversed polarity, it becomes possible to perform an accurate position setting of object M without the position of object M being set in a state where object M is shifted in a rotational direction within the horizontal plane, by microcoil MC11 working with magnet 48B and microcoil MC24 working with magnet 48A.

Figure 5A:
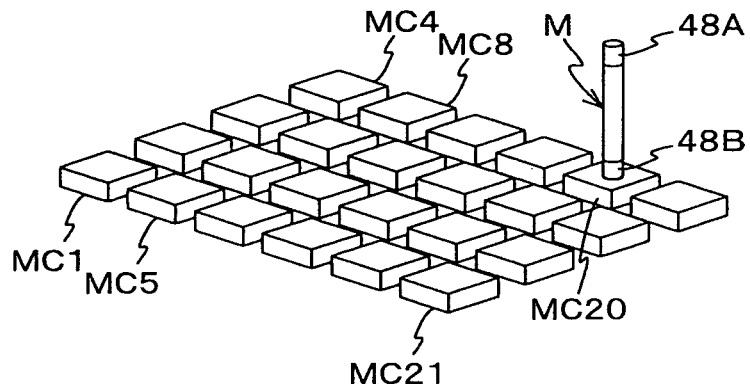
FIG. 5A is a view (No. 2) for describing a configuration and a method of setting a position of an object M.
Figure 5B:
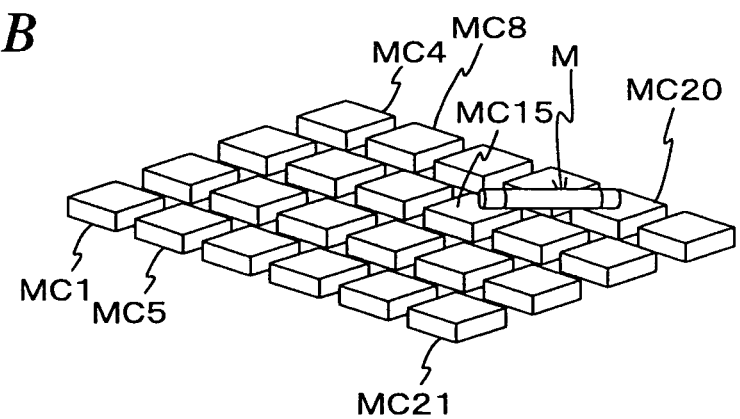
FIG. 5B is a view (No. 2) for describing the configuration and the method of setting the position of object M.
Figure 5C:
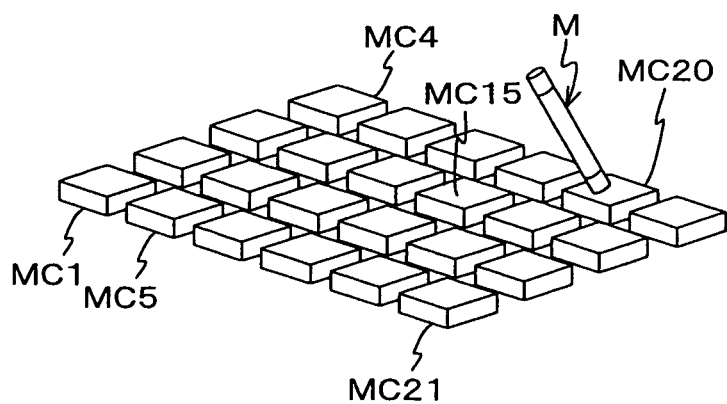
FIG. 5C is a view (No. 2) for describing the configuration and the method of setting the position of object M.

Meanwhile, in the case a cylindrical shaped object is employed as object M, magnets 48A and 48B are arranged on both ends of the object in the longitudinal direction as is shown in FIG. 5A. And according to this arrangement, by supplying current to a single coil (in this case, microcoil MC20), the position of the object can be set in a state where object M vertically stands above microcoil MC20 as is shown in FIG. 5A. Further, as is shown in FIG. 5B, for example, by supplying current in opposite directions to microcoils MC20 and MC15, the position of object M can be set in a horizontal state. Furthermore, as is shown in FIG. 5C, by supplying current (magnitude a) to microcoil 20 and also supplying current (magnitude a' (a'<a)) in the opposite direction to microcoil MC15, the position of object M can be set from the vertical state to a slightly tilted state.

Now, a concrete description will be made on object M, which is subject to position setting.

As the object subject to position setting, examples include an LSI (Large Scale Integration), a MEMS (Micro Electro Mechanical Systems) device and the like. Recently, the MEMS device is used in an acceleration sensor, a gyro sensor, a DMD (Digital Micro-mirror Device), a printer head of an inkjet printer and the like, and is manufactured using energy beam processing technology, which uses lithography technology or the like, and machining technique such as assembly. On manufacturing the device, a pattern is formed on the wafer with a semiconductor exposure apparatus for each layer, and then, development and etching processing are performed so as to make a mold of the components. In a normal LSI, the resist is removed after exposure, however, when manufacturing a MEMS device, the resist which also functions as a sacrifice layer is to be left till the end, and in the process of manufacturing a steric structure the gap is to be filled with the sacrifice layer. Then, by removing the sacrifice layers (resist) all at once by oxygen plasma processing, the steric structure is completed.

Incidentally, because the MEMS device is manufactured in large numbers on one silicon wafer using semiconductor manufacturing technology (lithography technology) as is described above, at the final stage of the manufacturing process dicing has to be performed on the silicon wafer in order to separate the devices.

The MEMS devices that have been separated have the size of around several μm in actual. When such fine objects are mounted on the upper surface of electromagnetic chuck 20 in a state where the objects are in contact with the upper surface, it is known that actions such as frictional force, electrostatic forces, van der Waals forces and the like are enhanced. These forces can almost be ignored when the size of the object is larger than a millimeter; however, in the case of a fine object such as the MEMS device, the forces become larger than a volume force such as an inertial force. Accordingly, in the embodiment, in order to relieve forces such as friction between object M and electromagnetic chuck 20, gas from gas supply unit 93 blows out from base surface 29a of electromagnetic chuck 20 via gas supply passage 42, which gives levitation force to the object.

Referring back to FIG. 1, the second holding unit 150 has a configuration similar to the first holding unit 50 although the unit is vertically reversed. More particularly, the second holding unit 150 includes a stage (a moving body or a table) ST2, an electromagnetic chuck 120 held under the lower surface of stage ST2, and a movement unit 130 that moves stage ST2 at least in the Y-axis direction.

Stage ST2 has a configuration similar to stage ST1, and electromagnetic chuck 120 has a configuration similar to electromagnetic chuck 20 and is held at the lower surface side of stage ST2 via a vacuum suction mechanism 94 (not shown in FIG. 2, refer to FIG. 9). Further, movement unit 130 also has a configuration similar to movement unit 30, and includes a Y-axis linear motor 136 that has, for example, a mover unit 132 and a stator unit 134 supported below ceiling surface CE via support members 138A and 138B. Incidentally, the point where stage ST2 has a vertical movement mechanism 95 (not shown in FIG. 2, refer to FIG. 9), which can drive electromagnetic chuck 120 in a vertical direction (an Z-axis direction), is different from stage ST1 (refer to FIG. 1).

Next, pre-alignment unit PA1 will be described, referring to FIGS. 6A to 7C. The operations of pre-alignment unit PA1 are actually performed under instructions from controller 90 in FIG. 9; however, in order to avoid complication in the description, the details will be omitted.

Figure 6B:
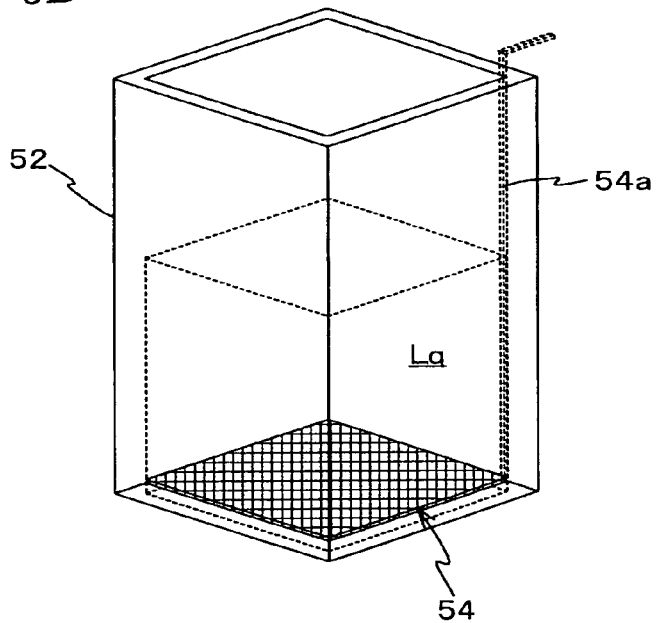
FIG. 6B is a view (No. 1) for describing the configuration of the pre-alignment unit and the method of pre-alignment.
Figure 7A:
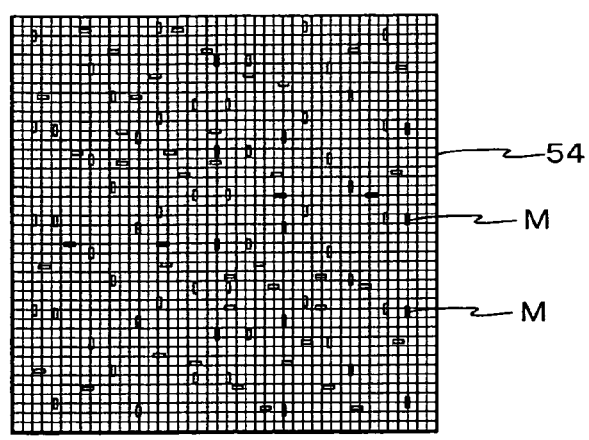
FIG. 7A is a view (No. 2) for describing a configuration of a pre-alignment unit and a method of pre-alignment.
Figure 7B:
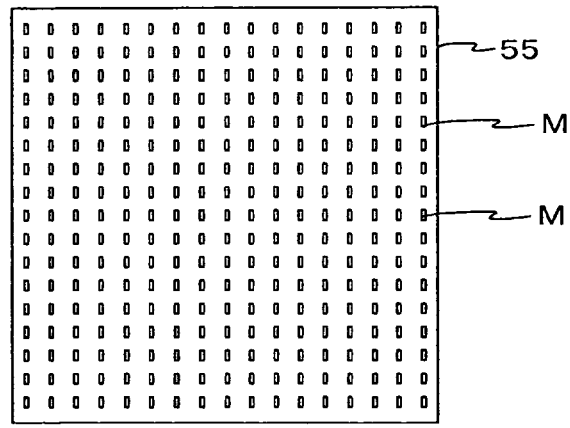
FIG. 7B is a view (No. 2) for describing the configuration of the pre-alignment unit and the method of pre-alignment.

Pre-alignment unit PA includes an agitation bath 52 (refer to FIG. 6B) that has a liquid Lq inside, a mesh 54 (refer to FIG. 6B) to which a handle 54a is attached partially, and a rough position setting mechanism 55 (refer to FIG. 7B). The grid spacing of the mesh of mesh 54 is set to a level where object M cannot pass through the grids.

Figure 6A:
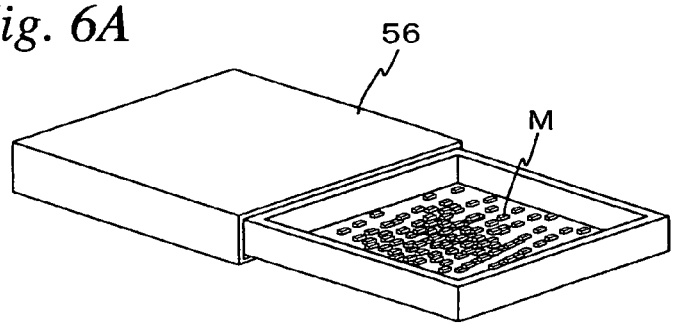
FIG. 6A is a view (No. 1) for describing a configuration of a pre-alignment unit and a method of pre-alignment.

In pre-alignment unit PA (refer to FIG. 1), first of all, a cassette 56 in which a predetermined number of objects M is stored as is shown in FIG. 6A is carried to the vicinity of agitation bath 52, and objects M inside cassette 56 are put into liquid Lq in agitation bath 52 shown in FIG. 6B. At this stage, there are some cases where objects M are connected together, due to magnets of objects M that stick together.

Figure 6C:
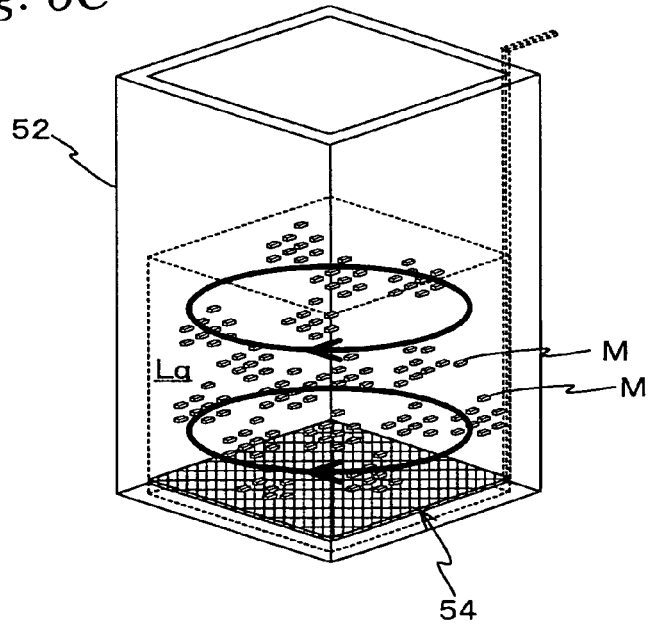
FIG. 6C is a view (No. 1) for describing the configuration of the pre-alignment unit and the method of pre-alignment.

Next, liquid Lq in agitation bath 52 is agitated as is shown in FIG. 6C, and the connection between objects M is discharged. And, by lifting mesh 54 up in a state where the connection between objects M is discharged, objects M can be scattered on the grids of mesh 54 (refer to FIG. 7A).

Next, objects M are picked up one by one using a pick up mechanism 96 (refer to FIG. 9) while the position of objects M which are scattered is recognized via an observation unit 99A (refer to FIG. 9) that uses, for example, a method such as an image processing method, and then objects M are roughly set sequentially on rough position setting mechanism 55 shown in FIG. 7B. Rough position setting mechanism 55 basically has a configuration similar to electromagnetic chuck 20; however, the spacing between the coils that are placed is set larger than the spacing of electromagnetic chuck 20. Accordingly, in the embodiment, by setting the position of one of the objects M in the vicinity of a desired position of rough position setting mechanism 55 using pick up mechanism 96 and supplying current to the coil in the vicinity of the desired position, the position of the object is roughly set. However, the attitude of the object is not in a desired attitude. When the operations above are completed, the objects are aligned on rough position setting mechanism 55, as is shown in, for example, FIG. 7B. Incidentally, as rough position setting mechanism 55 described earlier, a plate-shaped member that simply has a plurality of openings for vacuuming formed in a matrix on its surface can be used.

Figure 7C:
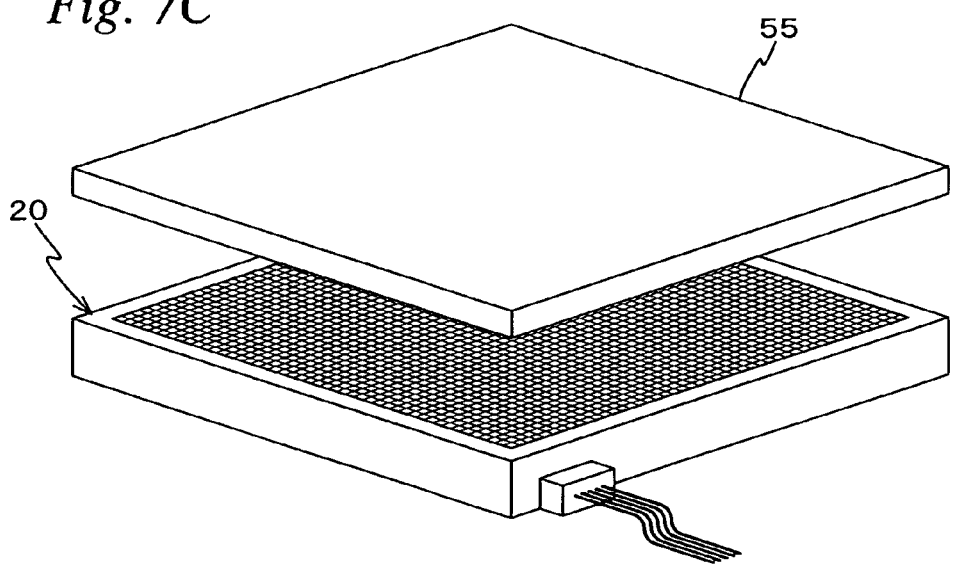
FIG. 7C is a view (No. 2) for describing the configuration of the pre-alignment unit and the method of pre-alignment.

Next, as is shown in FIG. 7C, rough position setting mechanism 55 is placed in a state where the surface holding objects M faces downward so that the surface faces electromagnetic chuck 20, and by stopping the current supply to the coil of rough position setting mechanism 55 the objects are supplied (delivered) to electromagnetic chuck 20. Then, in electromagnetic chuck 20, current is supplied to a desired microcoil MC, and the object that has undergone pre-alignment is positioned more accurately. In this case, because the object is roughly positioned using pre-alignment unit PA1, the moving distance of each object on electromagnetic chuck 20 can be shortened, and it becomes possible to perform position setting with high accuracy.

The other unit, pre-alignment unit PA2 (refer to FIG. 1), also has a similar configuration. More specifically, as is shown in FIG. 9, pre-alignment unit PA2 is equipped with rough position setting mechanism 55, pick up mechanism 96, an observation unit 99B and the like. Incidentally, in the embodiment, as the object that undergoes pre-alignment in pre-alignment unit PA2 and is held by electromagnetic chuck 120, a working tool N (refer to FIG. 8A) that applies processing such as opening holes or cutting away the MEMS device is to be employed. On one end of working tool N, a magnet is embedded. Further, in electromagnetic chuck 120, wiring is arranged so that current can be supplied to each of the working tools N that have been positioned. Accordingly, it is possible to supply current simultaneously to all of the working tools N, and all of the working tools N can be used at the same time. Incidentally, supply of current to working tool N is not indispensable, and in the case working tool N is a tool that does not require the usage of current, wiring for current supply does not have to be arranged.

Figure 8A:
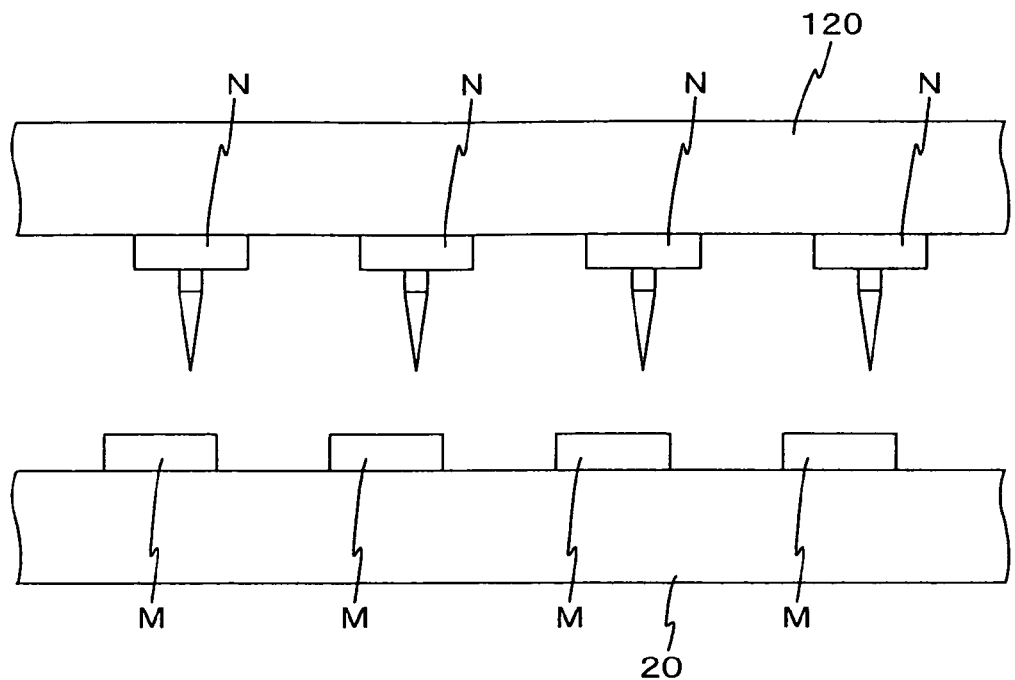
FIG. 8A is a view that shows a state where an object M and a working tool N face each other.

FIG. 1 shows a state where objects M consisting of MEMS devices and the like are positioned on electromagnetic chuck 20 below and working tools N are positioned at electromagnetic chuck 120 above. Then, object M and working tool N are positioned to a vertically corresponding positional relation as is shown in FIG. 8A.

Figure 8B:
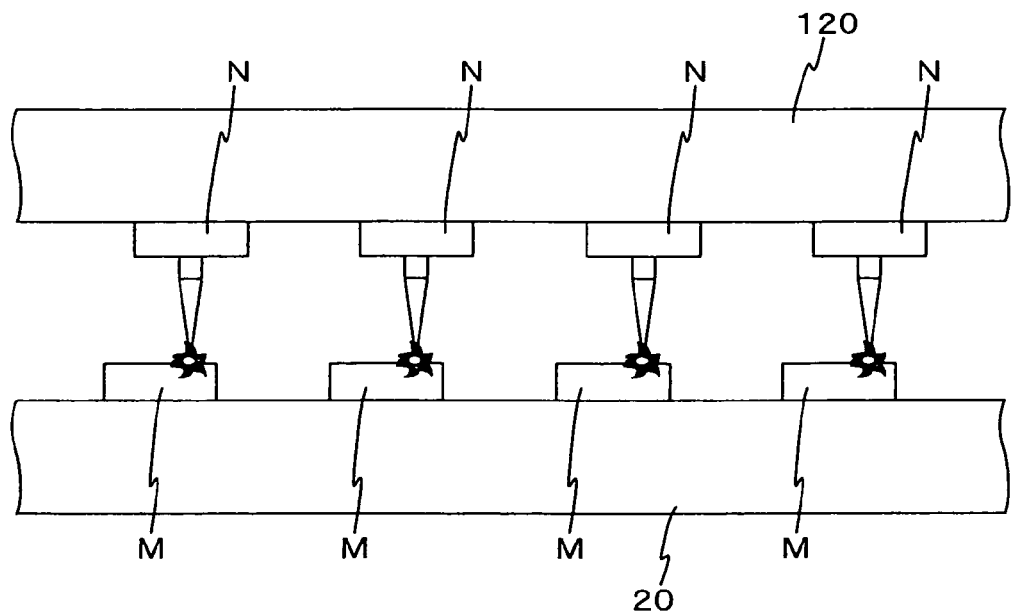
FIG. 8B is a view that shows a state where object M is processed using working tool N.

Then, assembly system 100 positions electromagnetic chuck 20 and electromagnetic chuck 120 to a position vertically facing each other, and for example, by moving the side of electromagnetic chuck 120 downward via vertical movement mechanism 95, each of the objects M and the corresponding working tool N come into contact as is shown in FIG. 8B, and by supplying current to all of the working tools N held by electromagnetic chuck 120 processing such as opening holes in all of the objects M held by electromagnetic chuck 20 can be applied.

The position of electromagnetic chuck 20 is measured via an interferometer 97 (refer to FIG. 9), and controller 90 moves stage ST1 via movement unit 30 based on the measurement results. Further, the position of electromagnetic chuck 120 is also measured via interferometer 97 (refer to FIG. 9), and controller 90 moves stage ST2 via movement unit 130 based on the measurement results.

Incidentally, in the embodiment, only one electromagnetic chuck (120) is arranged on the upper side. However, for example, in the case different processing is applied in succession to object M, an electromagnetic chuck (a third holding unit) that holds a different type of working tool can be arranged in the vicinity of electromagnetic chuck 120, and the number, the types, and the arrangement of the electromagnetic chuck are not particularly limited.

As is described in detail above, according to the first embodiment, in electromagnetic chuck 20, since current is supplied to a specific microcoil among a plurality of microcoils MC, which makes object M exert an electromagnetic force along with the magnet of object M, it becomes possible to hold object M in a state where object M is positioned at a desired position on the base surface. Further, since the gas that blows out from gas supply passage 42 gives levitation force to object M, it becomes possible to reduce the influence of forces that act between object M and the upper surface of the electromagnetic chuck when setting the position of object M.

Further, since the plurality of microcoils MC makes object M (or tool N) exert an electromagnetic force along with the magnet of object M (or tool N) after object M (or tool N) is positioned to the base surface of electromagnetic chuck 20 (or 120) using pre-alignment unit PA1 (or PA2), it is possible to hold object M (or tool N) in a state where object M (or tool N) is accurately positioned at a desired position of electromagnetic chuck 20 (or 120).

Further, since controller 90 performs the operation of current supply/stop to each of the plurality of microcoils MC, the object can be made to exert or stop exerting an electromagnetic force along with the magnet of object M (or N), which allows the object to be held in a state where the object is positioned at an appropriate position at an appropriate timing.

Further, in the embodiment, since object M is positioned with good precision by the first holding unit 50 and an object (working tool N) is held by the second holding unit 150, by placing the first holding unit 50 and the second holding unit 150 so that the unit face each other, it becomes possible to build a predetermined positional relation between object M and object N, which makes it possible to perform assembly using object M and object N with good accuracy.

Incidentally, in the embodiment above, the case has been described where the first holding unit 50 and the second holding unit 150 respectively have stage ST1 and stage ST2, which are movable in the Y-axis direction, however, the present invention is not limited to this, and the stage can be arranged in at least one of the first holding unit and the second holding unit. Further, in the embodiment above, the case has been described where stage ST1 and stage ST2 are movable in only the Y-axis direction using the Y-axis liner motors, however, by further arranging X-axis linear motors, the stages can be made to move also in the X-axis direction. Further, electromagnetic chuck 20 and electromagnetic chuck 120 can both be made movable in the Z-axis direction, or can be made movable in a direction of inclination (rotation) regarding each axis.

Incidentally, in the embodiment above, the case has been described where a linear motor was employed as a movement unit for moving stage ST1. The present invention, however, is not limited to this and other drive mechanisms such as, for example, various drive mechanisms as in a voice coil motor, a planar motor, or a motor of a ball joint method or the like can be employed, or these mechanisms can also be appropriately combined.

Incidentally, in the embodiment above, the position of electromagnetic chuck 20 was measured via interferometer 97 (refer to FIG. 9) and the position of electromagnetic chuck 120 was measured via interferometer 98 (refer to FIG. 9). However, the present invention is not limited to this, and a measurement unit such as an encoder or other various measurement units can be used for position measurement.

Figure 10:
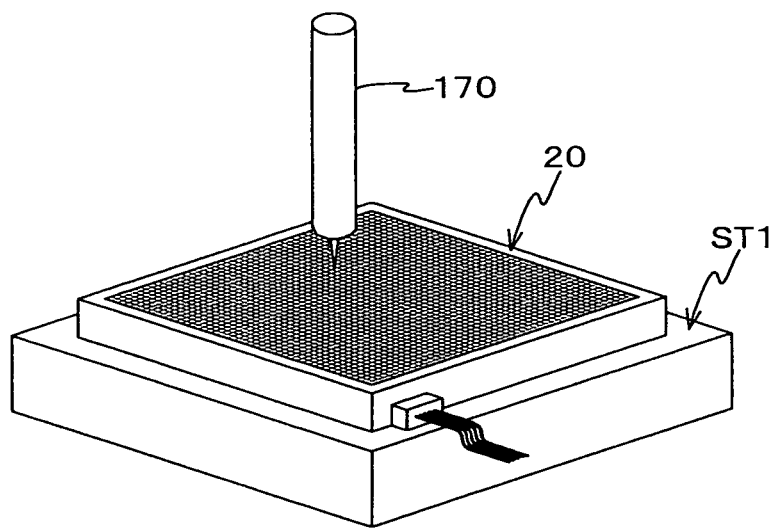
FIG. 10 is a view that shows a modified example of the first embodiment.

Incidentally, in the embodiment above, the case has been described where electromagnetic chuck 120 on the upper side is made to hold the plurality of working tools N and the plurality of objects held by electromagnetic chuck 20 on the lower side are simultaneously processed. The present invention, however, is not limited to this, and for example, the working tool prepared can be a single tool. More specifically, as is shown in FIG. 10, a working tool 170 can be arranged above electromagnetic chuck 20 without arranging the second holding unit 150 shown in FIG. 1, and processing can be sequentially applied to all the objects held on electromagnetic chuck 20 while moving stage ST1 within a two dimensional plane and in a vertical direction. In this case, stage ST1 can be moved as needed while measuring the position of object M held on electromagnetic chuck 20 by an image processing method or the like, or in the case the position where the object is positioned is known in advance, stage ST1 can be moved so that the object and working tool 170 mesh with each other. Incidentally, the present invention is not limited to this, and a configuration can be employed where the position of electromagnetic chuck 20 is fixed and the working tool 170 side can be moved within a horizontal plane and in a vertical direction, and processing can be applied to each object while working tool 170 is moved. Incidentally, working tool 170 is not limited to a singular arrangement as is shown in FIG. 10, and two or more working tools can be arranged.

Incidentally, in the embodiment above, gas was made to blow out upward from base surface 29a of electromagnetic chuck 20 in order to make the levitation force act on object M. However, the present invention is not limited to this, and for example, a magnetic force can be used to make the levitation force act on object M.

Incidentally, in the embodiment above, the case has been described where insulation layer 40 was arranged as coil holding board 29. However, the present invention is not limited to this and insulation layer 40 does not have to be arranged, and in this case, coil holding board 29 is made up only of wiring board 28.

A Second Embodiment

Next, a second embodiment of the present invention will be described, referring to FIGS. 11A to 12.

FIG. 11A shows a schematic configuration of the second embodiment in the present invention. As is obvious from FIG. 11A, the point where electromagnetic chuck 20 and electromagnetic chuck 120 are arranged is the same as the first embodiment previously described, however, the point where a power supply 70 for arc welding connects to electromagnetic chuck 120 is different from the first embodiment. Electromagnetic chuck 120 is made movable in the vertical direction (the Z-axis direction) using a vertical movement mechanism 95 (refer to FIG. 12) as in the first embodiment.

In the embodiment, for example, objects M (magnets are arranged in part of the objects as in the first embodiment) that have a rough cubic shape are held in a state where objects M are positioned spaced evenly apart using electromagnetic chuck 20, and objects M are also held in a state where objects M are positioned spaced evenly apart using electromagnetic chuck 120, as is shown in FIG. 11A. In this case, the space between adjacent objects M is set smaller than the width of object M. Incidentally, objects M look like they are arranged along in only one axial direction for the sake of convenience in FIG. 11A, however, objects M are actually arranged equally spaced apart in a two dimensional direction. Further, regarding the positioning of objects M, objects M can be positioned roughly in advance, using pre-alignment units similar to pre-alignment units PA1 and PA2 in the first embodiment previously described.

Object M is held by both electromagnetic chucks 20 and 120 in the manner described above, and in a state where both electromagnetic chucks face each other, electromagnetic chuck 120 is driven downward via vertical movement mechanism 95 (refer to FIG. 12) so that the electromagnetic chucks move closer together. And, in a state where objects M on the upper side and objects M on the lower side are in contact, voltage is supplied from power supply 70. By this operation, the portion where the objects above and the objects below are in contact is arc welded as is shown in FIG. 11B, and the objects that are in contact are fixed together. In this case, it can be said that the objects on the upper side function as a welding rod in a normal arc welding, and the objects on the lower side function as a base material.

Figure 12:
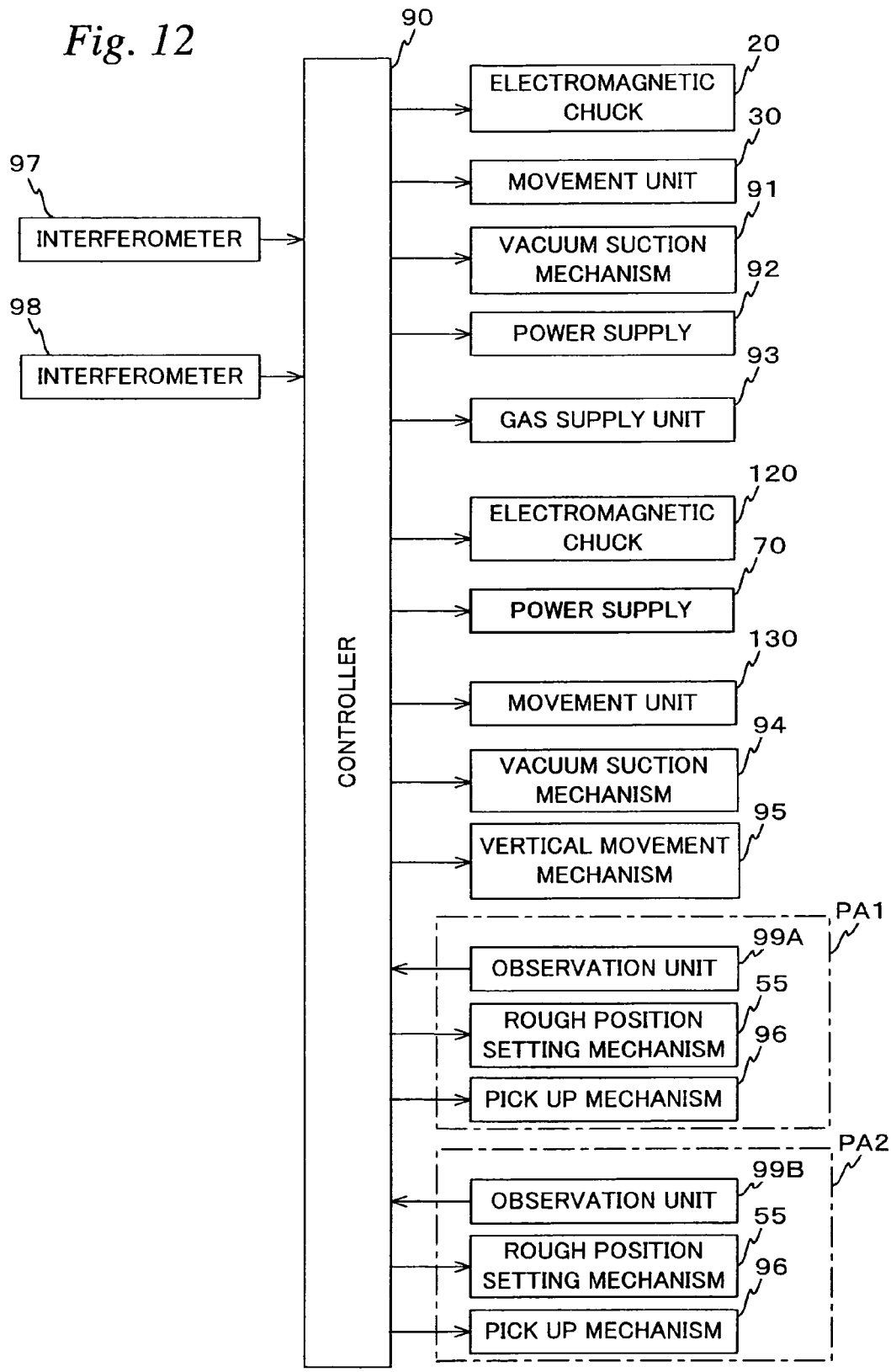
FIG. 12 is a block diagram of a control system related to the second embodiment.

When arc welding is completed in the manner described above, electromagnetic chuck 120 on the upper side is moved away from electromagnetic chuck 20 on the lower side (refer to FIG. 11C) by releasing the holding force to objects M of electromagnetic chuck 120 on the upper side and moving electromagnetic chuck 120 upward via vertical movement mechanism 95 (refer to FIG. 12).

Then, in a similar manner, by making electromagnetic chuck 120 on the upper side hold objects M and performing arc welding by moving both electromagnetic chucks close together, it becomes possible to assemble (build up) object M three dimensionally (refer to FIG. 11D).

The structure that has been built up in the manner above can be used, for example, as a heat sink, a heater, or a filter focusing on the point that it has a large surface, area, or by focusing on the point that many gaps are formed in between the objects, the structure has a potential for various usages as a metal material that is light, with high rigidity.

As is described above, according to the second embodiment, because it is possible to accurately arrange the objects using the electromagnetic chuck in the present invention even if the object is fine, and to also weld the objects by the pressure applied from power supply 70 for arc welding, various three dimensional structural objects can be built up (manufactured).

Incidentally, in the second embodiment above, the case has been described where objects M with a rough cubic shape have been employed as the objects, however, the present invention is not limited to this, and it is possible to use objects with various shapes that have a normalized structure. For example, various three dimensional structural objects can be built up (manufactured) with a spherical object, a columnar object, or a triangular-pyramid shaped object or the like. In this case, it is possible to build up the structural object while changing the attitude of the object, as is shown in FIGS. 5A to 5C.

Incidentally, in the second embodiment, the case has been described where arc welding has been used, however, the present invention is not limited to this, and for example, the objects can be joined using adhesives, or the objects can be joined by hydrogen bonding.

A Third Embodiment

Next, a processing unit 80 related to a third embodiment of the present invention will be described, referring to FIGS. 13A to 14C. In the third embodiment, electromagnetic chuck 20 used in the first and second embodiments is used as a constituent part of processing unit 80.

Figure 13A:
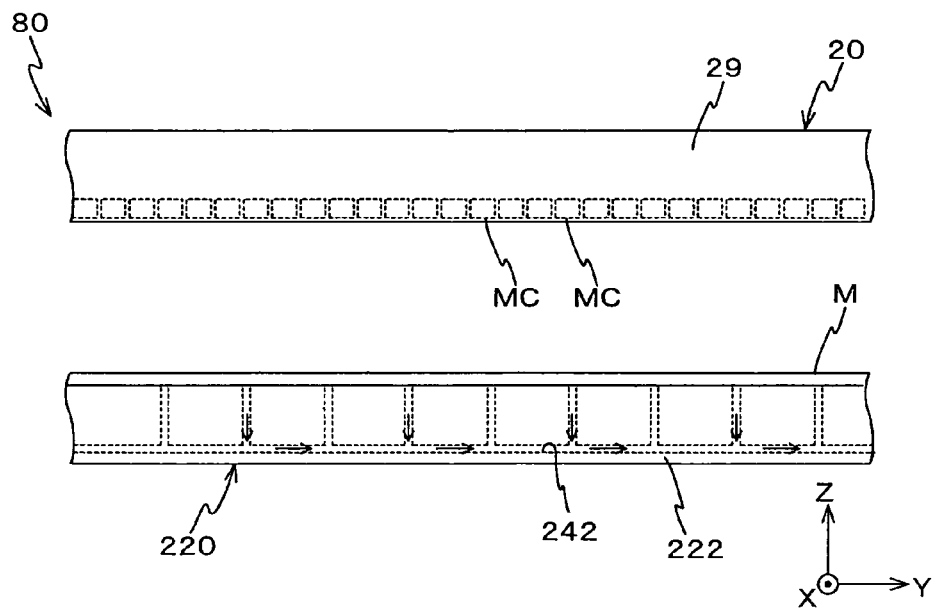
FIG. 13A is a view that shows a configuration of a processing unit of a third embodiment.

As is shown in FIG. 13A, processing unit 80 of the third embodiment is equipped with electromagnetic chuck 20 and a vacuum chuck 220 arranged facing electromagnetic chuck 20.

Although the unit is arranged upside down, electromagnetic chuck 20 is configured similar to the first embodiment and is equipped with coil holding board 29 and a plurality of microcoils MC arranged on coil holding board 29. Electromagnetic chuck 20 is movable in the vertical direction (the Z-axis direction) by a vertical movement mechanism, which is similar to the one arranged on the electromagnetic chuck 120 side in the first and second embodiments.

Vacuum chuck 220 is equipped with a base 222. Inside base 222, a vacuum pipeline 242 is formed, and the vacuum suction force via the pipeline holds object M mounted on the upper surface of vacuum chuck 220 by suction. In vacuum pipeline 242, a valve is arranged, and by a controller controlling the open/close operation of the valve, it becomes possible to change the position where object M is vacuum suctioned.

Figure 13B:
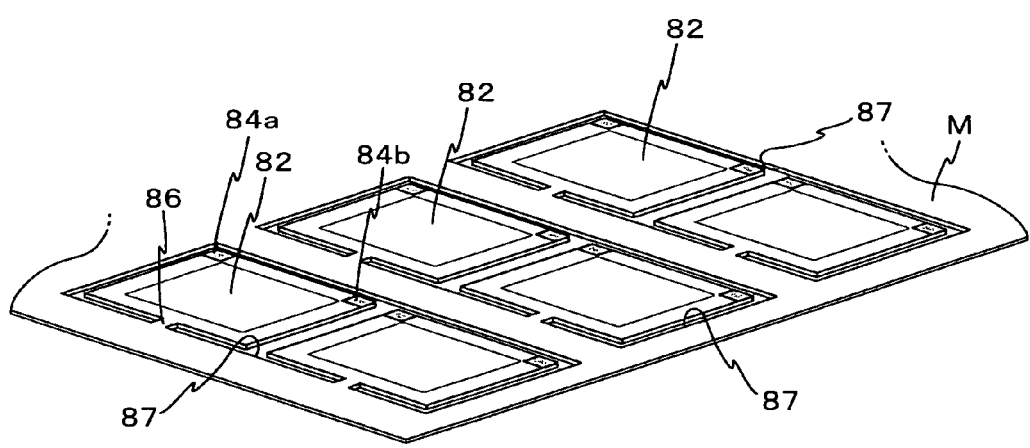
FIG. 13B is a perspective view for describing a configuration of an object subject to processing by the processing unit in FIG. 13A.

As is shown in FIG. 13A, object M of a thin plate shape is held by vacuum suction on vacuum chuck 220. This object M is a MEMS mirror, and a plurality of areas divided by empty spaces 87 is formed. Within each of the areas a mirror section 82 is formed as is shown in FIG. 13B. At two places in the vicinity of mirror section 82, magnets 84a and 84b are arranged. Incidentally, magnets 84a and 84b can have an opposite polarity or the polarity can be the same. Further, in vacuum chuck 220, the sections besides the areas divided by empty spaces 87 are to be vacuum chucked.

In the embodiment, the section including mirror section 82 is to be processed into a standing (bent) state from the position of a hinge 96, using processing unit 80 configured in the manner described above.

Figure 14A:
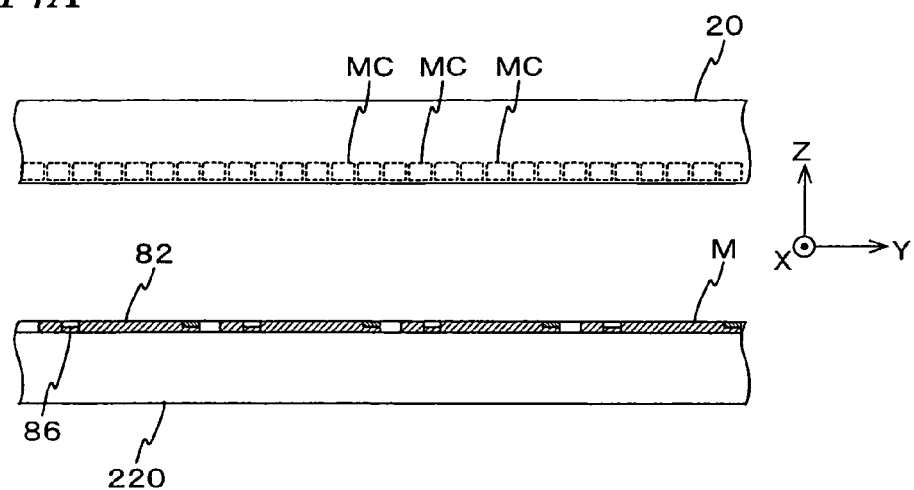
FIG. 14A is a view for describing a processing method by the processing unit in FIG. 13A.
Figure 14B:
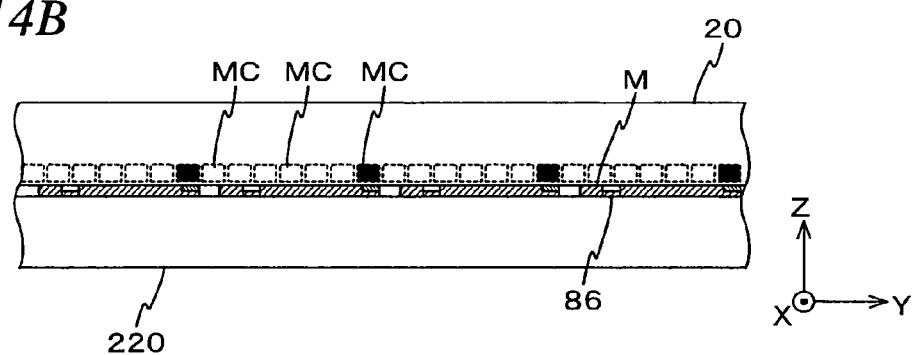
FIG. 14B is a view for describing the processing method by the processing unit in FIG. 13A.

More specifically, object M is mounted on vacuum chuck 220 as is shown in FIG. 14A, and in a state held by vacuum suction, electromagnetic chuck 20 comes in to contact or moves closer to object M from above (refer to FIG. 14B). Then, from this state, current is supplied to microcoils (microcoils shown in a blackened state in FIG. 14B) of electromagnetic chuck 20 located at the positions corresponding to magnets 84a and 84b of object M, and magnets 84a and 84b of object M are suctioned.

Figure 14C:
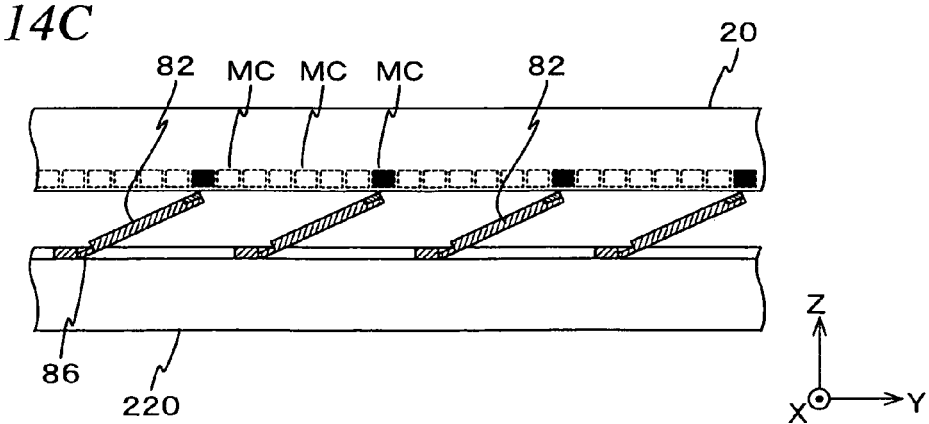
FIG. 14C is a view for describing the processing method by the processing unit in FIG. 13A.

Next, by moving electromagnetic chuck 20 in a direction that intersects the horizontal surface (in this case, a +Z direction) via the vertical movement mechanism in a state where the suction of magnets 84a and 84b is maintained, it becomes possible to make mirror section 82 move into a state where it stands upright from the vicinity of hinge section 86 as is shown in FIG. 14C.

As is described above, by using processing unit 80 of the third embodiment, fine sections such as the mirror section of the MEMS mirror can be processed (bent) easily to a standing state, and the processing (bending) of all the mirror sections 82 can be performed all at once.

Incidentally, in the third embodiment above, the case has been described where the MEMS mirror is processed into a standing state by moving electromagnetic chuck 20 upward via the vertical movement mechanism, however, the present invention is not limited to this, and mirror section 82 can be processed (bent) to a standing state by making vacuum chuck 220 vertically movable by the vertical movement mechanism and lowering vacuum chuck 220 toward electromagnetic chuck 20 via the vertical movement mechanism. Further, the vertical movement mechanism can be arranged in both vacuum chuck 220 and electromagnetic chuck 20, and mirror section 82 can be processed (bent) to a standing state by moving vacuum chuck 220 and electromagnetic chuck 20 away from each other via the vertical movement mechanisms. Incidentally, as the vertical movement mechanisms, various types of drive mechanisms can be employed besides the linear motor.

Incidentally, in the third embodiment above, the case has been described where electromagnetic chuck 20 and vacuum chuck 220 were relatively moved in the Z-axis direction, however, the present invention is not limited to this, and both chucks can be relatively moved in various directions as long as the direction intersects the XY surface and is also a direction suitable for processing the object.

Incidentally, in the third embodiment above, vacuum chuck 220 was used to hold the object (MEMS mirror), however, the present invention is not limited to this, and for example, a chuck mechanism that mechanically holds the vicinity of the peripheral section of MEMS mirror can be used.

Incidentally, in the embodiment above, the case has been described where the MEMS mirror is processed using processing unit 80. However, the present invention is not limited to this, and it can be suitably applied to the processing of various objects that are finely processed (objects that have a magnetic substance section and an empty space section).

A Fourth Embodiment

Next, a fourth embodiment of the present invention will be described, referring to FIG. 15.

Figure 15:
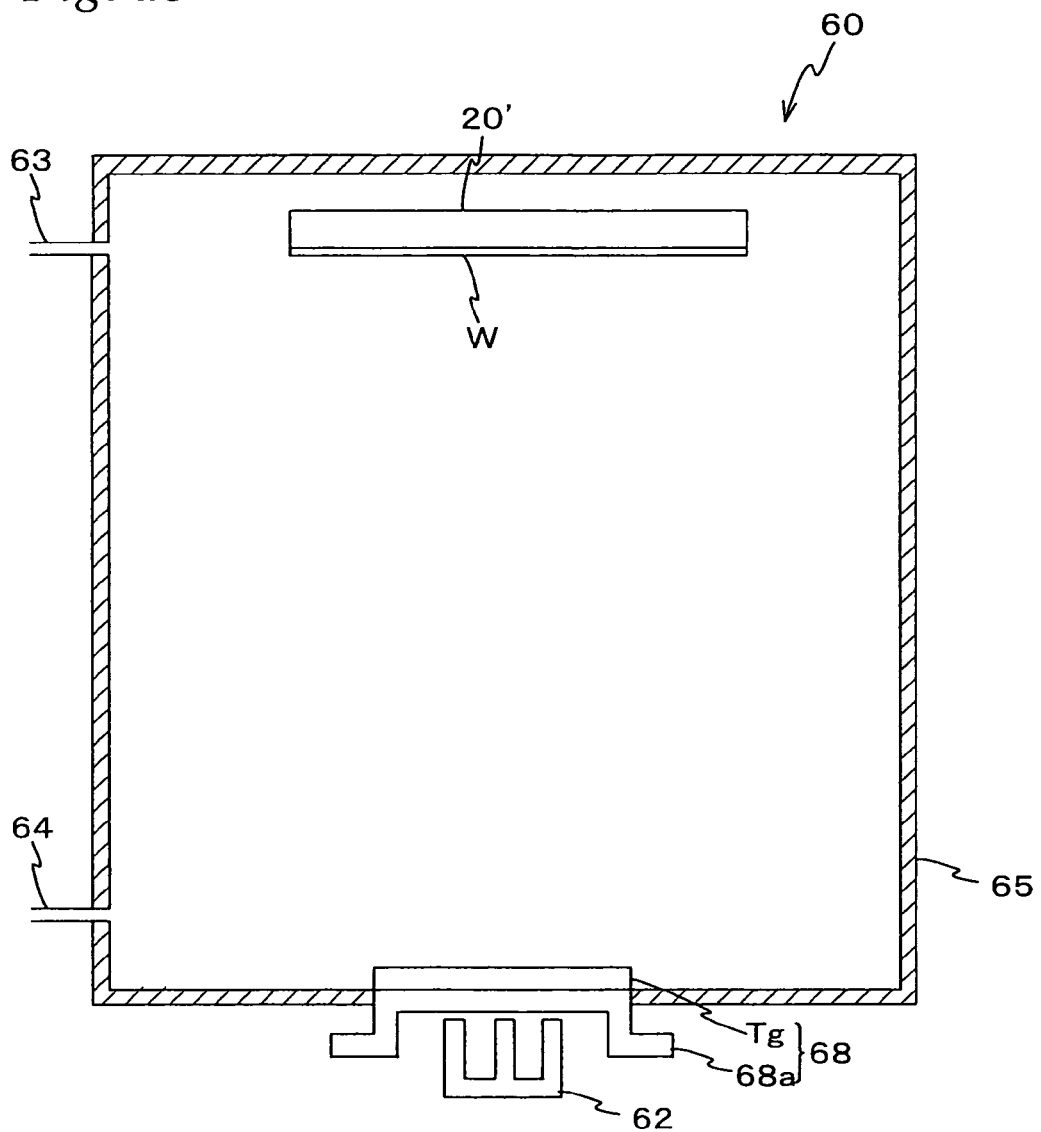
FIG. 15 is a view that shows a configuration of a sputtering unit of the fourth embodiment.

As is shown in FIG. 15, a sputtering unit 60 of the fourth embodiment is equipped with a vacuum chamber 65, an electromagnetic chuck 20' that holds a base material W arranged within vacuum chamber 65, a cathode 68 that contains a target Tg arranged in the vicinity of electromagnetic chuck 20', and a magnetic pole 62 arranged outside vacuum chamber 65 on the rear surface of cathode 68.

Vacuum chamber 65 has a guide pipe 63 that guides the argon gas for sputtering and an exhaust pipe 64 that connects partially to a pump, and for example, a predetermined amount of argon gas is guided inside vacuum chamber 65 via guide pipe 63 after the inside has been exhausted via exhaust pipe 64.

Electromagnetic chuck 20' is configured similar to electromagnetic chuck 20 of the first embodiment previously described, however it does not have a gas supply passage. Incidentally, instead of the gas supply passage, a vacuum chuck mechanism for holding base material W can be arranged.

Cathode 68 is equipped with a target Tg and a backing plate 68a arranged on the rear surface side of target Tg. In a liquid passage formed inside the backing plate, a coolant is supplied, which cools target Tg. Cathode 68 connects to a power supply (not shown), which supplies the sputtering power.

Magnetic pole 62 has an S pole and an N pole, and generates a magnetic force.

In sputtering unit 60 configured in the manner described above, when the power supply supplies a negative direct current voltage to cathode 68, a sputtering power (e.g. 200 watt) is supplied to cathode 68. And by the sputtering power, a high electric field is formed from cathode 68 to the electromagnetic chuck, and with the electric field and a magnetic force generated between the N pole and the S pole of magnetic pole 62, a sputtering magnetic field is formed.

Argon atoms ionize by being put under an electric field near target Tg and trap the magnetic field; therefore, ionization is further accelerated. Furthermore, the electrons generated by the ionization collide with the argon atoms, which further accelerates the ionization.

In the manner described above, argon ions are generated near target Tg, accelerated by the electric field in the vicinity of target Tg, and collide with target Tg with great force. This collision causes part of target Tg to become fine particles (clutter) that are sputtered (recoiled), and of the target particles that have been sputtered, the ones that move in the direction of base material W collide with base material W and adhere thereon. And a repetition of such an adhesion of the target particles forms a thin film on the surface of base material W.

Target particles have a nature of being drawn toward places where a magnetic field is generated, therefore, by supplying current selectively to a plurality of microcoils that configure electromagnetic chuck 20', target particles can be deposited on the surface of base material W at the section corresponding to the microcoils where the current was supplied, which makes it possible to form a thin film in a state where patterning is performed on the surface of base material W.

Incidentally, in the fourth embodiment, the case has been described where argon gas is filled within vacuum chamber 65, however, the present invention is not limited to this, and vacuum chamber 65 can be filled with, for example, nitrogen gas or neon gas.

As is described above, in the sputtering unit in the fourth embodiment, by controlling the current supply to the microcoils, it becomes possible to form patterns on base material W that corresponds to the distribution of microcoils to which current is supplied.

Incidentally, in each of the embodiments above, the case has been described where the controller performs the switching between current supply and stopping the current supply to each coil. However, the present invention is not limited to this, and for example, an IC arranged on the wiring board can be made to have the function of supplying/stopping the current to the coils and current control can be performed through the IC.

Figure 16:
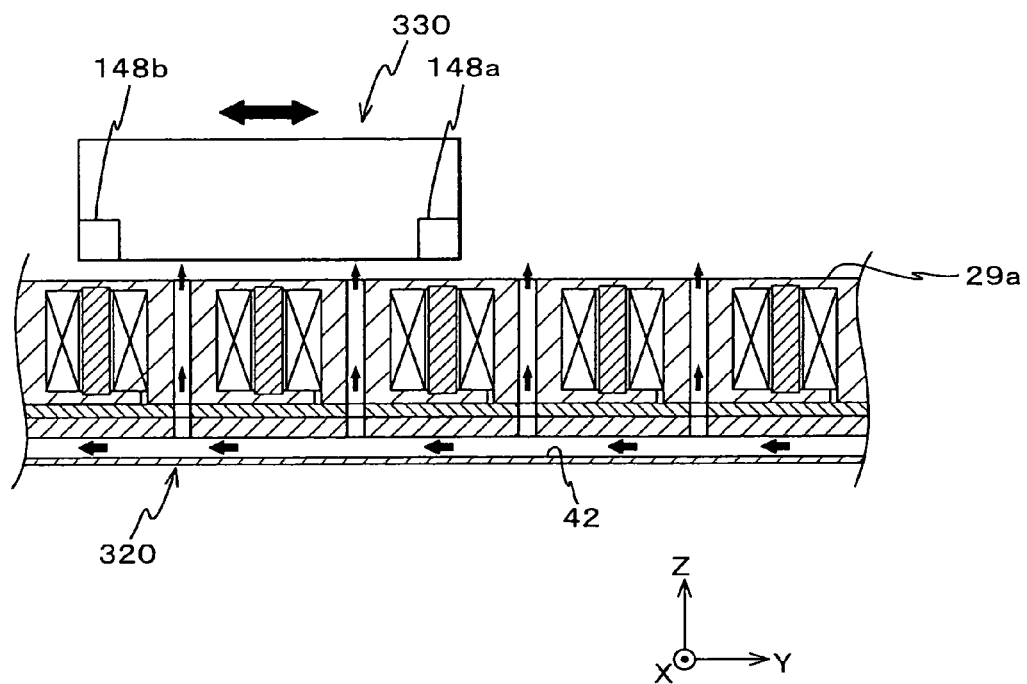
FIG. 16 is a view that shows a configuration of a planar motor unit related to a modified example.

Incidentally, in each of the embodiments above, the case has been described where the electromagnetic chuck was used to hold an object of some kind. However, the present invention is not limited to this, and for example, the electromagnetic chuck can be employed as a stator of a planar motor unit like the one shown in FIG. 16.

More specifically, a stator 320 side is configured similarly to electromagnetic chuck 20 in the first embodiment above and magnets 148a and 148b are arranged similarly to object M in the first embodiment on a mover 330 side, however, the control method of the switching between supplying the current and stopping the current supply of the microcoils is different. To be more precise, by performing switching control on mover 330 so that the microcoil to which the current is supplied is altered according to the moving speed (required velocity) of mover 330, the mover is moved in a desired direction.

In this case, due to the gas supplied from gas supply passage 42 to the space between the lower surface of the mover and base surface 29a, a clearance of several μm is formed between the lower surface of mover 330 and base surface 29a. Incidentally, with, or instead of gas supply passage 42, dynamical pressure generated by the movement of mover 330 can be used as a bearing. For example, the lower surface section of mover 330 in at least the direction of movement can be formed in the shape of a wedge, and according to a principle as in the levitation of a head over a hard disk used in a personal computer or the like, a levitation force can be generated according to the moving speed of mover 330 so as to form a clearance of several μm between the lower surface of mover 330 and base surface 29a.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An assembly system comprising:
   a first holding unit that holds a first object which at least partially contains a magnetic substance, the first holding unit comprising:
      a first base on which the first object is placed;
      a plurality of conductive materials arranged in the first base that works with the magnetic substance to make the first object exert an electromagnetic force; and
      a first levitation force mechanism that gives levitation force to the first object; and
   a second holding unit that faces the first holding unit, the second holding unit holding a second object, which is placed facing the first object held by the first holding unit, wherein
   the second object at least partially contains a magnetic substance, and
   the second holding unit includes a second base on which the second object is placed, a plurality of conductive materials arranged in the second base that works with the magnetic substance to make the second object exert an electromagnetic force, and a second levitation force mechanism that gives levitation force to the second object.

2. The assembly system of claim 1, wherein
   the second object is a processing object that applies processing to the first object, and the system further comprises:
   a processing control unit that controls the processing of the first object applied by the second object.

3. The assembly system of claim 1, the system further comprising: a welding unit that welds the first object and the second object.

4. The assembly system of claim 1, the system further comprising: a relative movement unit that relatively moves the first holding unit and the second holding unit.

5. An assembly system comprising:
   a first holding unit that holds a first object which contains at least partially a magnetic substance, the first holding unit comprising:
      a base on which the first object is placed;
      a plurality of conductive materials arranged in the base that works with the magnetic substance to make the first object exert an electromagnetic force; and
      a levitation force mechanism that gives levitation force to the first object; and
   a second holding unit that holds a second object, which is placed facing the first object held by the first holding unit, the system further comprising:
   a third holding unit that is arranged separately from the second holding unit facing the first object held by the first holding unit, and also holds a third object which contains at least partially a magnetic substance.

6. The assembly system of claim 5, wherein
   the third holding unit includes another base on which the third object is placed, a plurality of conductive materials arranged in the another base that works with the magnetic substance to make the third object exert an electromagnetic force, and another levitation force mechanism that gives levitation force to the third object.

* * * * *

UNITED STATES PATENT AND TRADEMARK OFFICE
CERTIFICATE OF CORRECTION

| | | |
|---|---|---|
| PATENT NO. | : 8,668,191 B2 | Page 1 of 1 |
| APPLICATION NO. | : 13/317994 | |
| DATED | : March 11, 2014 | |
| INVENTOR(S) | : Yuichi Shibazaki | |

It is certified that error appears in the above-identified patent and that said Letters Patent is hereby corrected as shown below:

On page 2 of the title pages, under item (56), OTHER PUBLICATIONS,

"Jan. 4, 2010 Office Action issued in U.S. Appl. No. 11/509,648." should be
-- Jan. 4, 2011 Office Action issued in U.S. Appl. No. 11/509,648. --

Signed and Sealed this
Nineteenth Day of August, 2014

Michelle K. Lee
*Deputy Director of the United States Patent and Trademark Office*